(12) United States Patent
Baumgartner et al.

(10) Patent No.: US 6,698,003 B2
(45) Date of Patent: Feb. 24, 2004

(54) FRAMEWORK FOR MULTIPLE-ENGINE BASED VERIFICATION TOOLS FOR INTEGRATED CIRCUITS

(75) Inventors: Jason Raymond Baumgartner, Austin, TX (US); Geert Janssen, Putnam Valley, NY (US); Andreas Kuehlmann, Berkeley, CA (US); Viresh Paruthi, Austin, TX (US); Louise Helen Trevillyan, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 10/006,076

(22) Filed: Dec. 6, 2001

(65) Prior Publication Data

US 2003/0110455 A1 Jun. 12, 2003

(51) Int. Cl.[7] .......................... G06F 17/50; G06F 11/00
(52) U.S. Cl. .................. 716/4; 716/1; 716/2; 716/3; 716/18; 716/5; 703/14
(58) Field of Search .................... 716/4, 1–3, 5–7, 716/18; 703/14–22; 707/14–22

(56) References Cited

U.S. PATENT DOCUMENTS

| | | | | | |
|---|---|---|---|---|---|
| 5,526,517 | A | * | 6/1996 | Jones et al. ..................... | 707/8 |
| 5,649,165 | A | * | 7/1997 | Jain et al. ...................... | 716/5 |
| 5,678,040 | A | * | 10/1997 | Vasudevan et al. ............ | 707/8 |
| 5,956,257 | A | * | 9/1999 | Ginetti et al. .................. | 716/3 |
| 6,052,524 | A | * | 4/2000 | Pauna .......................... | 703/22 |
| 6,077,304 | A | * | 6/2000 | Kasuya ......................... | 703/14 |
| 6,182,258 | B1 | * | 1/2001 | Hollander .................... | 714/739 |
| 6,240,543 | B1 | * | 5/2001 | Bhandari ..................... | 716/18 |
| 6,247,165 | B1 | * | 6/2001 | Wohl et al. .................... | 716/5 |
| 6,446,243 | B1 | * | 9/2002 | Huang et al. .................. | 716/7 |
| 6,470,481 | B2 | * | 10/2002 | Brouhard et al. .............. | 716/5 |
| 6,560,758 | B1 | * | 5/2003 | Jain ............................. | 716/7 |
| 2002/0188910 | A1 | * | 12/2002 | Zizzo ........................... | 716/1 |

\* cited by examiner

Primary Examiner—Matthew Smith
Assistant Examiner—Magid Y Dimyan
(74) Attorney, Agent, or Firm—Joseph P. Lally; Casimer K. Salys

(57) ABSTRACT

A design verification system comprising a set of modular verification engines invoked by a framework that manages the control flow between the engines. The framework receives a verification problem from an application and attempts to solve it by instantiating one or more engine in a customizable sequence or set of sequences. Each verification engine is configured to achieve a specific verification objective and may be coded against a common API to facilitate exchange of information between the engines. The verification engines may include reduction engines, which attempt to simplify a problem by modifying it or decomposing it, and decision engines, which attempt to solve problems that are passed to them. As a verification problem is passed from one engine to the next, the engine may alter the verification problem such that a decision engine at the end of the sequence may receive a verification problem that is simpler to solve than the original problem specified by the system user. If the decision engine is able to solve a problem by determining a state or sequence of states that produces a specified value on a specified node of the design, the engine passes the determined sequence to the engine that invoked it in the form of a counterexample trace after modifying it to "undo" whatever effect it may have had on the problem. The engines may also learn facts, such as a lighthouse that serves as an aid to solving the verification problem, and pass these facts to the other engines.

28 Claims, 3 Drawing Sheets

FRAMEWORK FOR MULTIPLE-ENGINE BASED VERIFICATION TOOLS FOR INTEGRATED CIRCUITS

BACKGROUND

1. Field of the Present Invention

The present invention generally relates to the field of integrated circuit design verification and more particularly to a method and system for managing verification using modular design verification engines and a verification framework that employ a common interface to facilitate the exchange of verification information and design flows.

2. History of Related Art

As the complexity of microprocessors and other sophisticated integrated circuits has increased over the years, the resources devoted to design verification has accounted for an increasingly large percentage of the total resources required to develop and manufacture an integrated circuit. Indeed, the verification of advanced microprocessors with multiprocessing capability is now estimated to consume more time, labor, and other resources than the actual design of the device.

Traditionally, functional verification has been accomplished by generating a large number of test programs or test cases and running these test programs on a simulator that attempts to model the operation of the device. Designers and verification engineers frequently develop these test cases manually with the help of various random and specific test generators. As the number of transistors, functions, registers, and other facilities in the integrated circuit have increased, conventional verification methods have responded by simply increasing the number of tests that are simulated. Unfortunately, generating a seemingly infinite number of tests is an inefficient and unreliable method of verifying the functionality of all components in the processor.

In the early days of microprocessor development, inefficiencies in functional verification were tolerated because the size of the test space (measured, for example, by the number of states the microprocessor may assume) was sufficiently small. In addition, early microprocessors typically had fewer functional units than modern microprocessors, and the interactions between the components and functions were well understood and controlled. The increasing number of functional units in microprocessors is significant from a verification perspective because interaction between functional units can no longer be ignored or only loosely verified by conventional verification methodologies.

The diverse applications in which modern integrated circuits are employed makes it impossible to predict and plan for the type of software applications that will run on them and thus the state and interdependence that will be exercised in the field are rather large and generally non-deterministic. Roughly speaking, the test space of a microprocessor is approximately equal to $2^n$ where n represents the number of latches (state storage devices) within the microprocessor. From this approximation, it will be appreciated that the test space of microprocessors increases exponentially as the number of latches is increased.

The conventional approach to functional verification, in which increased complexity in a device is verified by simply increasing the number of tests that are simulated, is rapidly becoming infeasible. In addition, because the input to a simulator in a conventional verification process is simply a large number of deterministic tests or randomly generated tests, the output of the simulation must be painstakingly evaluated to determine whether a particular simulation was successful in testing the intended functionality of the device.

It would be desirable to implement a test verification system that addressed the problems associated with design verification. It would be further desirable if the implemented system employed a set of modular and relatively compact verification engines that could be invoked in a determinable sequence. It would be further desirable if the system included a verification framework capable of communicating with a user application program to enable the user to create customized sequences comprised of the modular engines and to apply the customized sequence to a defined verification problem.

SUMMARY OF THE INVENTION

The problems identified above are in large part addressed by a design verification system that incorporates a set of modular verification engines within a framework that manages the control flow between the various engines. The framework receives a verification problem from an application, and attempts to solve it by invoking one or more of the engines in a customizable sequence or set of sequences. Each of the verification engines is designed to achieve a specific verification objective. Each of the engines is coded against or complies with a common application program interface (API) to facilitate exchange of information between the engines. The verification engines may include modification engines, which attempt to simplify a problem by modifying it or decomposing it, and decision engines, which attempt to solve problems that are passed to them. As a verification problem is passed from one engine to the next, the engine may alter the verification problem such that a decision engine at the end of the sequence may receive a verification problem that is simpler to solve than the original problem specified by the system user.

If the decision engine is able to solve a problem, such as by determining a state or sequence of states that produces a specified value on a specified node of the design, the decision engine will pass the determined sequence (commonly referred to as a counter example trace) to its parent engine (i.e., the engine that invoked it). Before a trace is passed from a "child" engine to its parent, the engine is responsible for modifying the trace to "undo" whatever effect it may have had on the problem. Imagine, for example, a Boolean optimization engine (BOE) receives a netlist or other form of circuit model from the framework and modifies the model by merging two or more nodes before passing the model to a decision engine. If the BOE subsequently receives a trace from the decision engine, the BOE must modify the trace to reflect the existence of all nodes that existed prior to modification by the BOE. In this manner, the framework ultimately receives a netlist that is relevant to the circuit model it started with while the subordinate engines are able to operate on simplified models.

BRIEF DESCRIPTION OF THE DRAWINGS

Other objects and advantages of the invention will become apparent upon reading the following detailed description and upon reference to the accompanying drawings in which.

Figure 1:
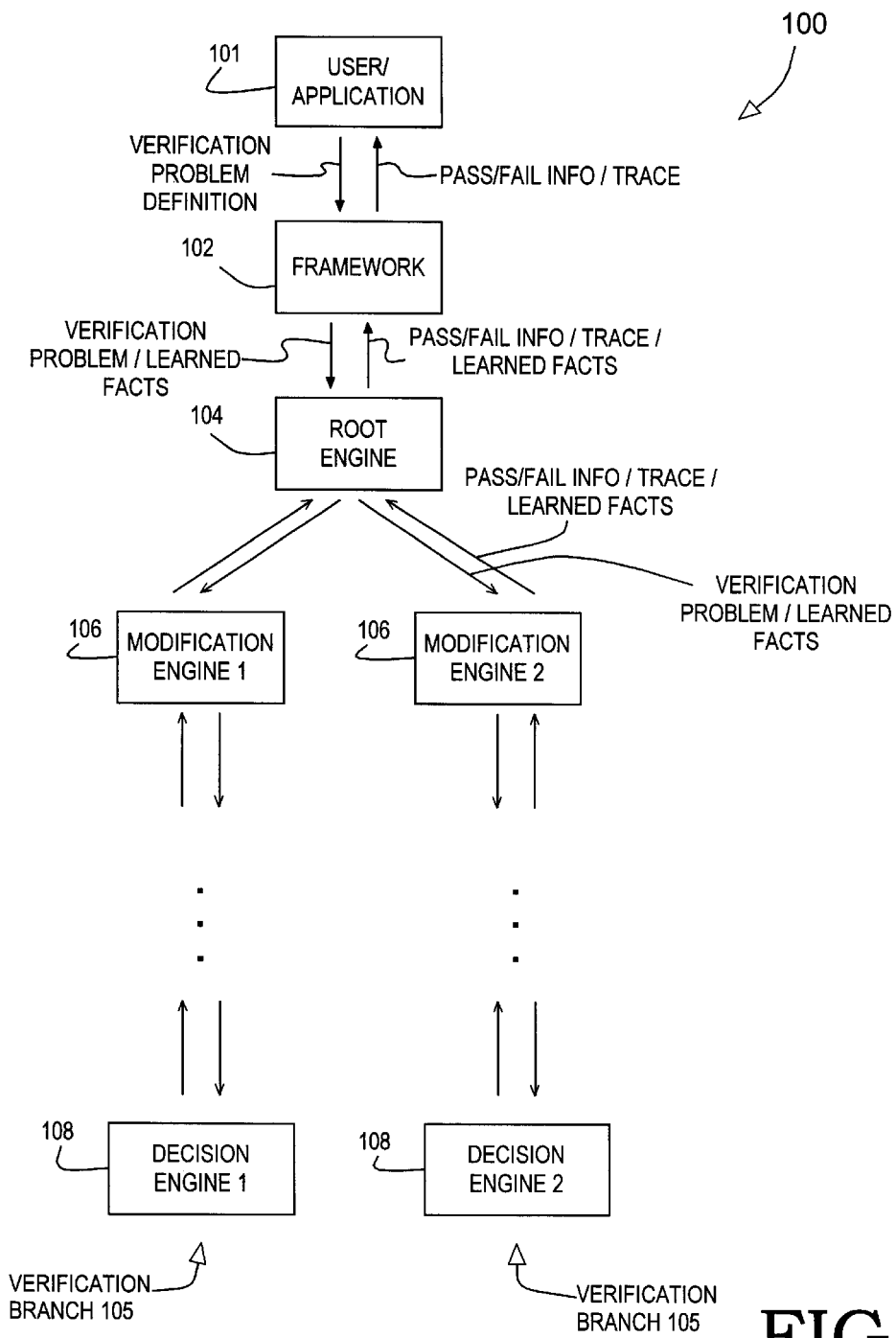
FIG. 1 is a block diagram illustrating a generalized design verification flow according to one embodiment of the invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the invention contemplates a method and system for verifying the design of an integrated circuit. The verification system includes a verification framework that communicates with a user application program and coordinates the activities of a set of verification engines. The verification framework is responsible for instantiating the verification engines in one or more sequences and passing a verification problem to the instantiated engines. The engines may be instantiated in a tree-like fashion having multiple verification branches. Each of the branches may attempt to verify a problem in a different way. The verification engines are typically classified as either modification engines that modify a problem or decision engines that attempt to solve a problem. The framework and various engines typically comply with or are coded against a common API to facilitate the exchange of verification information among them.

Figure 3:
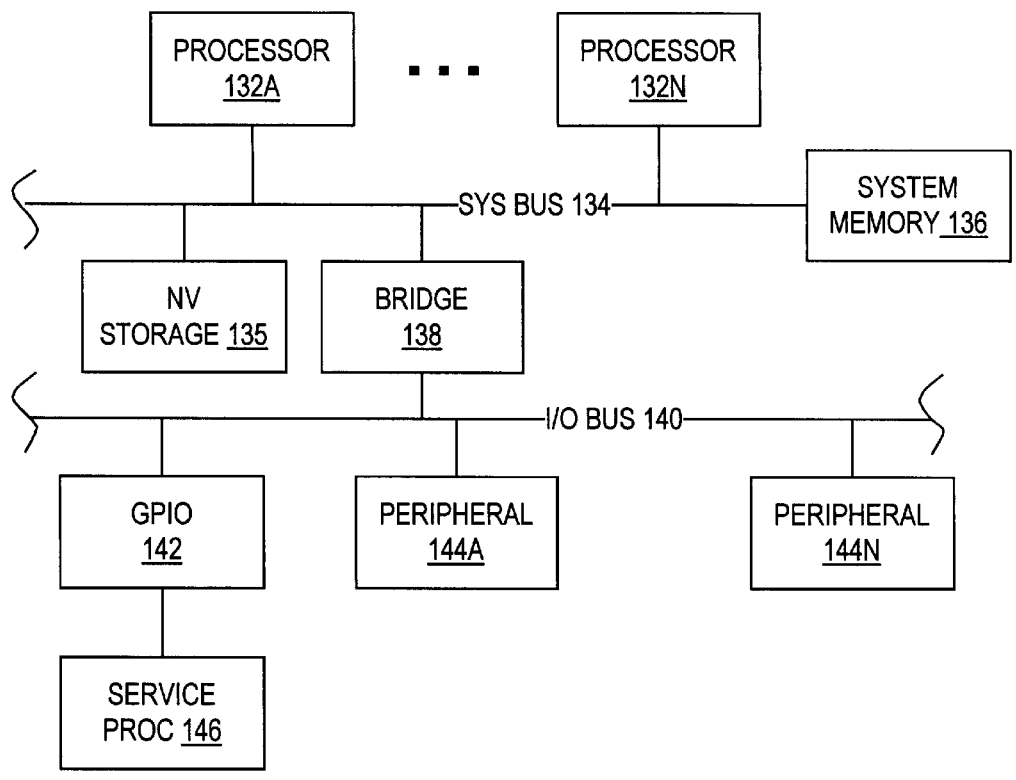
FIG. 3 is a block diagram of selected elements of a data processing system suitable for implementing the present invention.

Turning now to the drawings, FIG. 3 is a block diagram of selected features of a data processing system 130 suitable for implementing the present invention. In the depicted embodiment, data processing system 130 includes a set of main processors 132A through 132N (generically or collectively referred to as processor(s) 132) that are connected to a system bus 134. A common system memory 136 is accessible to each processor 132 via system bus 134. The system memory is typically implemented with a volatile storage medium such as an array of dynamic random access memory (DRAM) devices. The depicted architecture of data processing system 130 is frequently referred to as a symmetric multiprocessor (SMP) system because each processor 132 has substantially equal or access to system memory 136.

In data processing system 130, a bus bridge 138 provides an interface between system bus 134 and an I/O bus 140 to which one or more peripheral devices 144A through 144N (generically or collectively referred to as peripheral device(s) 144) as well as a general purpose I/O (GPIO) port are connected. Peripheral devices 144 may include devices such as a graphics adapter, a high-speed network adapter or network interface card (NIC), a hard-disk controller, and the like. I/O bus 140 is typically compliant with one of several industry standard I/O bus specifications including, as a common example, the Peripheral Components Interface (PCI) bus as specified in *PCI Local Bus Specification Rev* 2.2 by the PCI Special Interest Group (www.pcisig.com).

The depicted embodiment of data processing system 130 includes a local service processor 146 connected to GPIO port 142. Local service processor 146 is configured to provide support for main processors 132. This support may include, for example, monitoring the power supplied to main processor(s) 132 and, in the event of a blade crash, initiating a restart of the main processors.

Turning now to FIG. 1, a conceptual illustration of selected portions of a design verification system 100 according to one embodiment of the invention is presented. In the depicted embodiment, system 100 includes a design verification framework 102. Framework 102 typically includes an interface to communicate with one or more application programs 101 that are invoked by a system user. Framework 102 is further configured to provide a verification problem to a verification engine identified in FIG. 1 as root engine 104. The verification problem typically includes a netlist or another suitable representation of a circuit structure and a set of expected values at one or more of the circuit's nets that are to be proven or dis-proven. An expected value is proven if a state or sequence of states produces the expected value on the specified circuit net(s).

Framework 102 is configured to create instances of (instantiate) a set of verification engines in one or more sequences typically defined by the user via application program 101. The instantiated engines are typically arranged in a tree-like architecture having one or more verification branches from which other branches may split off. At the apex of this tree structure is a root verification engine 104 that receives a verification problem from framework 102. Framework 102 controls the flow of a verification problem among the verification engines in a branch.

As illustrated in FIG. 1, framework 102 is configured interact with a user through application program 101 to create one or more verification branches 105, each of which includes a user-defined sequence of one or more verification engines represented in FIG. 1 by reference numerals 104, 106, and 108. The verification engines that may be instantiated or invoked by framework 102 include modification engines 106 and decision engines 108. As their names suggest, modification engines 106 are configured to modify (and presumably simplify) a given verification problem while decision engines 108 act on a modified or unmodified verification problem to attempt to solve the problem.

Framework 102 is responsible for applying each of the one or more verification branches 105 to a verification problem. Within each branch 105, the verification problem may be modified by one or more modification engines 106 until, ultimately, the branch terminates with a "leaf" engine representing the last engine on a given branch. The leaf engine is typically a decision engine 108 that attempts to solve a verification problem.

After framework 102 has applied a verification branch 105 to a verification problem, the leaf engine has typically identified at least one counterexample trace for the original verification problem or proved that the problem has no solution. Assuming that the leaf engine in a particular branch 105 was successful in solving particular problem (i.e., the leaf engine has generated at least one counterexample trace), it then passes the discovered trace to its parent engine. The parent engine is then responsible for modifying the received trace to reflect any modifications to the netlist that it made before it passed the netlist to the leaf engine. After modifying the trace, the parent engine then passes the modified trace to its parent engine, which further modifies the trace to reflect modifications it initiated and so forth until the trace is passed from root engine 104 back to the framework 102. In this manner, the trace passed back to framework 102 from each of the branches 105 will be consistent with the netlist generated by framework 102.

As indicated previously, framework and the various verification engines are preferably compliant with a common API to facilitate the exchange of information passed from one engine to the next. In this embodiment, each verification engine must support a specified set of functions so that verification tasks will be handled in a consistent manner by each of the engines. The API, for example, may specify a function to create the logical AND of two nets in a netlist.

The verification engines may, during processing of a verification problem, learn certain verification related facts that may make it simple for other engines to solve the verification problem(s). The engine that learned the fact propagates any such learned information to its parent and its child. Each of these modules, in turn, will pass the learned information to their respective parents and children. In this manner, the learned information is propagated throughout the tree arrangement. Thus, as illustrated in FIG. 1, the information passed from root engine 104 to each child engine 106 may include a verification problem as well as learned facts about the design. The information passed back from children engine 106 to root engine 104 may include pass/fail information, one or more counterexample traces, and learned facts.

Figure 2:
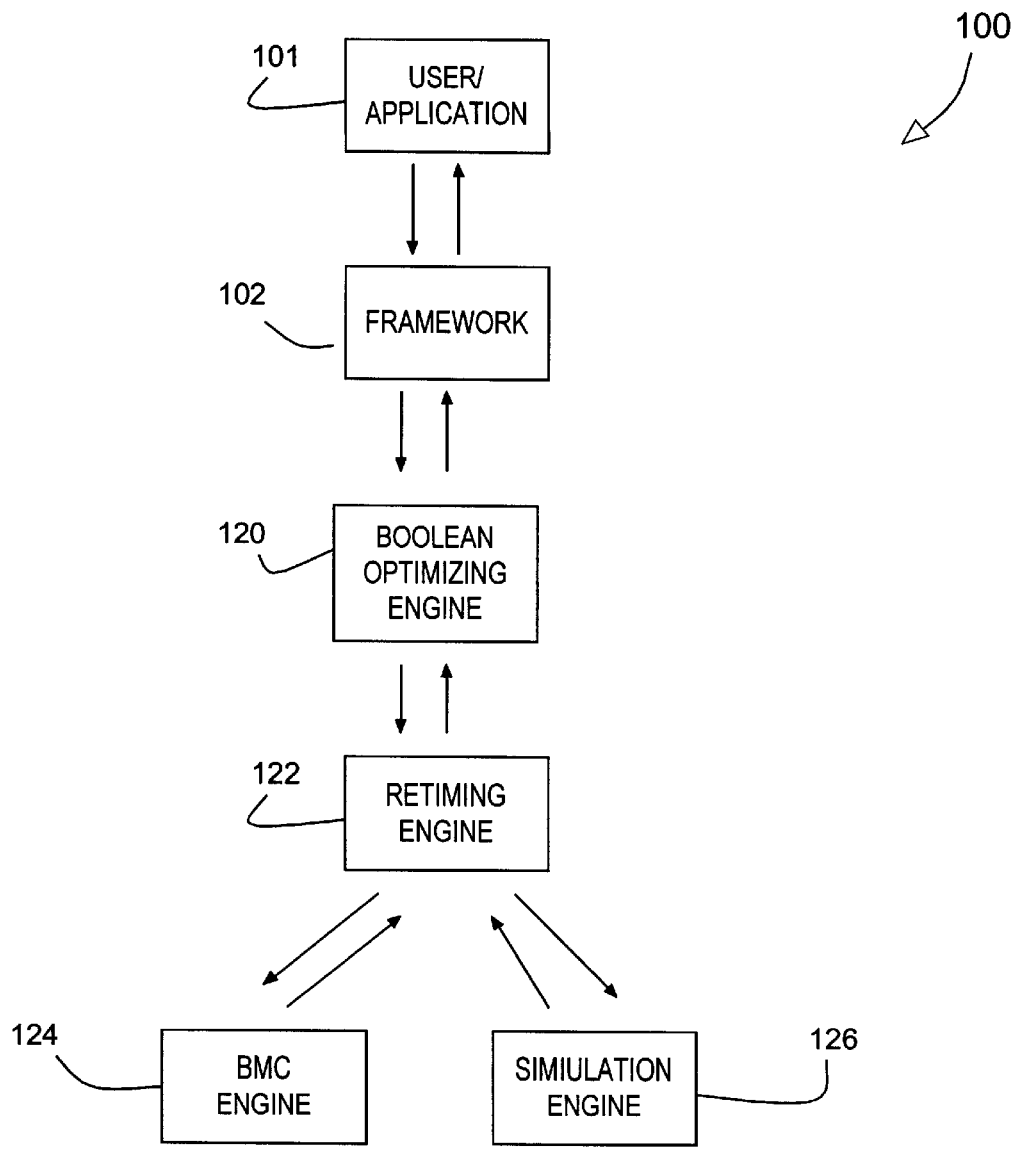
FIG. 2 is a block diagram illustrating an exemplary design verification flow according to the present invention.

Turning now to FIG. 2, additional detail of the generalized system described with respect to FIG. 1 is provided by way of an exemplary verification flow according to one embodiment of the invention. In the embodiment depicted in FIG. 2, an application/user invokes verification system 100 by specifying a verification problem to framework 102. Typically, the specification of the verification problem includes sending a netlist and set of expected values for specified nets. As an example, the verification problem may represent a query of whether a CHECKSTOP signal is ever asserted where the CHECKSTOP signals is intended to be asserted to indicate a fault. Verification system 100 is required to prove or disprove whether the specified signal (a single CHECKSTOP signal in the example) can attain a specified value (a logical "1" in the example). If verification system 100 is able to demonstrate that the CHECKSTOP can be asserted, the system is expected to provide a counterexample trace depicted the sequence of values of the circuit nets over time that leads to the failure. This trace may comprise a simulation-style of trace from an initial value of the circuit to any state in which the CHECKSTOP is asserted.

Framework 102 receives the netlist and the specified nets and expected values. Framework 102 may then instantiate a modification engine to attempt to simplify the problem before executing a decision engine. In the depicted embodiment, the invoked modification engine is a reduction engine in the form of a Boolean optimization engine (BOE) 120. Reduction engines such as BOE 120 attempt to simplify the problem by, for example, discovering functionally equivalent nodes in the netlist and merging them together. If BOE 120 is able to simplify the functional model of the circuit, it modifies the netlist accordingly and passes the modified verification problem to its child engine.

In the depicted example, the child engine of BOE 120 the modification engine identified as retiming engine 122 is an example of an abstraction engine. Abstraction engines such as retiming engine 122 may attempt to further simplify the verification problem by eliminating selected state-holding elements (latches). The verification problem specified by retiming engine 122 is then passed to a pair of child engines along a respective pair of verification branches.

In addition to reduction engines and abstraction engines, modification engines 106 may include one or more decomposition engines. As their name suggests, decomposition engines are configured to modify a verification problem by breaking the problem down into two or more sub-problems. As a simple example, a decomposition engine may create two sub-problems, one for the case in which an input or signal is a "0" and another sub-problem for the case in which the input or signal is a "1."

Framework 102 then creates a pair of verification branches by invoking a pair of decision engines and instructing the retiming engine 122 to pass the modified verification problem to each decision engine. The first decision engines invoked by framework 102 is a Bounded model checking (BMC) engine 124 while the second decision engine invoked is a simulation engine 126. BMC engine 124 then performs a bounded model check of the netlist while simulation engine 126 is simultaneously performing a simulation of the test problem based upon a set of predetermined test cases. Thus, the depicted embodiment of verification system 100 is employed to execute a pair of decision engines simultaneously on a common verification problem. The BMC engine 124 typically performs a substantially exhaustive search that may take a considerable amount of execution time but provides a higher level of confidence with respect to the verification problem at hand. Simulation engine 126, on the other hand, may execute relatively quickly, but may not generate the same level of confidence if a counterexample is not found.

One or both of the decision engines depicted may determine that, if a certain internal net in the circuit assumes a certain value, the verification problem will ultimately be disproved. If, for example, the assertion of some internal net guarantees that the CHECKSTOP signal will be asserted, the internal net is said to be a "lighthouse" for the CHECKSTOP signal. The verification problem can be simplified by modifying the problem to look for assertion of the lighthouse rather than the assertion of the specified net. The lighthouse may simplify a verification problem because it is easier to prove from a probability standpoint, or because the lighthouse is reachable at a shallower sequential depth than the specified net, or both. The discovery of a lighthouse is an example of a learned factor that the discovering verification engine can then communicate to its parent engine, namely retiming engine 122. Retiming engine 122 then passes the lighthouse or other learned fact to its other child engine (BMC engine 124) and its parent BOE 120. Decision engines 124 and 126 will then attempt to discover a solution for the light house as well as for the originally specified problem thereby increasing the probability that a solution for one or the other problems will be discovered.

If one of the decision engines 124 or 126 discovers a solution to either an originally specified verification problem or to a lighthouse, the engine will build a trace (typically referred to as a counterexample trace) illustrating the sequence from an initial state to a state where the target is asserted. If simulation engine 126 is able to hit the lighthouse, it builds a trace indicating the path to the lighthouse and passes it to its parent, retiming engine 122. Because the lighthouse was discovered by BMC engine 124, which is a child of retiming engine 122, retiming engine 122 translates the trace to the problem domain that it passed to BMC engine originally, which is the same problem domain that retiming engine 122 passed to simulation engine 126 originally. BMC engine 124 receives the trace indicating the path to the lighthouse and, based on its previously discovered knowledge of how to transition from the lighthouse to the assertion of CHECKSTOP, BMC engine 124 will build the counterexample trace indicating how to transition from an initial state to the assertion of CHECKSTOP.

BMC engine 124 then passes this trace to back to retiming engine 122. Upon receiving the CEHCKSTOP counterexample, retiming engine 122 will back-translate the received trace to account for any netlist modifications that retiming engine 122 made originally. Retiming engine 122 then sends the "un-retimed" CHECKSTOP trace to its parent BOE 120. BOE 120 will back-translate its received trace to un-merge any nodes that it merged originally and send the modified trace up to framework 102, which passes it on to user application 101. Framework 102 would then cancel the CHECKSTOP target in its root engine (BOE 120 in this example), which would propagate the cancellation of the target throughout the instantiated engines. If any targets remain unresolved, the system would continue to attempt to solve them.

It will be apparent to those skilled in the art having the benefit of this disclosure that the present invention contemplates a method and system for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A verification system, comprising:
    a set of verification engines including a decision engine for attempting to solve a verification problem;
    a system framework configured to communicate with an application program and further configured to instantiate at least one verification engine from the set of verification engines in a user defined sequence, wherein the sequence terminates with the decision engine; and
    means within at least one of the verification engines for communicating verification information to at least one other engine.

2. The system of claim 1, wherein the set of verification engines and the framework are compliant with a common application program interface.

3. The system of claim 1, wherein the set of verification engines further includes at least one modification engine selected from the group of engines including a reduction engine, an abstraction engine, and a decomposition engine.

4. The system of claim 1, wherein the set of decision engines includes an exhaustive decision engine and a non-exhaustive engine.

5. The system of claim 1, wherein the framework is configured to instantiate the engines in a first sequence and a second sequence wherein the first and second sequence originate from a common verification engine.

6. The system of claim 5, wherein the first and second sequences are configured to attempt to solve the two branches simultaneously.

7. The system of claim 1, wherein the decision engines is configured upon discovering a solution to a verification problem, to build a trace to illustrate the solution.

8. The system of claim 7, wherein the framework is configured to pass the trace from the decision engine to its parent engine.

9. The system of claim 8, wherein the parent engine is configured to modify the trace to reverse any modification of the circuit associated with the original verification problem attributable to the parent.

10. The system of claim 1, wherein the engines are configured to transfer verification problem information, and signal trace information among themselves.

11. The system of claim 10, wherein the engines are further configured to learn facts about a design during processing and to communicate the learned facts to other engines.

12. The system of claim 11, wherein the learned facts include the discovery of a lighthouse that serves as a aid in finding a solution for the verification problem.

13. The system of claim 1, wherein the verification problem comprises a netlist and a set of nets and expected values.

14. A method of verifying the design of an integrated circuit, comprising:
    instantiating a set of verification engines in a predetermined sequence using a verification framework, wherein the set of verification engines includes at least one modification engine selected from the group of engines including a reduction engine, an abstraction engine, and a decomposition engine and at least one decision engine configured to determine a solution for the verification problem;
    applying the sequence of engines to the verification problem;
    upon determining a solution to the verification problem with the decision engine, building a trace to illustrate the solution; and
    passing the trace from the decision engine to its parent engines in a sequence opposite to the predetermined sequence until the trace is returned to the verification framework.

15. The method of claim 14, wherein each parent engine is configured to modify the trace to reverse any modification of the circuit associated with the original verification problem attributable to the corresponding parent.

16. The method of claim 15, wherein the engines are further configured to learn facts about a design during processing and to communicate the learned facts to the other engines.

17. The method of claim 16, wherein the learned facts include the discovery of a lighthouse that serves as an aid in determining a solution of the verification problem.

18. The method of claim 14, wherein the set of verification engines and the framework are compliant with a common application program interface.

19. The method of claim 14, wherein the at least one decision engine is selected from a set of decision engines including an exhaustive decision engine and a non-exhaustive engine.

20. The method of claim 14, wherein the framework is configured to instantiate the engines in a first sequence and a second sequence wherein the first and second sequence originate from a common verification engine.

21. The method of claim 20, wherein the first and second sequences are configured to attempt to solve the two branches simultaneously.

22. A computer program product comprising a set of computer executable instruction for verifying the design of an integrated circuit, the set of instructions stored on a computer readable medium, comprising:
    computer code means for instantiating a set of verification engines in a predetermined sequence using a verification framework, wherein the set of verification engines includes at least one decision engine configured to determine a solution for the verification problem and wherein the sequence terminates with a decision engine;
    computer code means for applying the sequence of engines to the verification problem;
    computer code means for building a trace to illustrate the solution upon determining a solution to the verification problem with the decision engine; and
    computer code means for passing the trace from the decision engine to its parent engines in a sequence opposite to the predetermined sequence until the trace is returned to the verification framework;

wherein each parent engine is configured to modify the trace to reverse any modification of the circuit associated with the orginial verification problem attributable to the corresponding parent.

23. The computer program product of claim 22, wherein the engines are further configured to learn facts about a design during processing and to communicate the learned facts to the other engines.

24. The computer program product of claim 23, wherein the learned facts include the discovery of a lighthouse that serves as an aid in determining a solution of the verification problem.

25. The computer program product of claim 22, wherein the set of verification engines and the framework are compliant with a common application program interface.

26. The computer program product of claim 22, wherein the set of verification engines further includes at least one modification engine selected from the group of engines including a reduction engine, an abstraction engine, and a decomposition engine and further wherein the set of decision engines includes an exhaustive decision engine and a non-exhaustive engine.

27. The computer program product of claim 22, wherein the framework is configured to instantiate the engines in a first sequence and a second sequence wherein the first and second sequence originate from a common verification engine.

28. The computer program product of claim 27, first and second sequences are configured to attempt to solve the two branches simultaneously.

* * * * *

UNITED STATES PATENT AND TRADEMARK OFFICE
CERTIFICATE OF CORRECTION

| | |
|---|---|
| PATENT NO. | : 6,698,003 B2 |
| APPLICATION NO. | : 10/006076 |
| DATED | : February 24, 2004 |
| INVENTOR(S) | : Jason Raymond Baumgartner et al. |

It is certified that error appears in the above-identified patent and that said Letters Patent is hereby corrected as shown below:

Col. 7, line 21, claim 1, should read:

1. A verification system, comprising:

a set of verification engines including a decision engine for attempting to solve a verification problem;

a system framework configured to communicate with an application program and further configured to instantiate at least one verification engine from the set of verification engines in a user defined sequence, wherein the sequence terminates with the decision engine; and means within at least one of the verification engines for communicating verification information to at least one other engine.

Col. 10, line 12, claim 28 should read:

28. The computer program product of claim 27, wherein the first and second sequences are configured to attempt to solve the two branches simultaneously.

Signed and Sealed this

Second Day of January, 2007

JON W. DUDAS
*Director of the United States Patent and Trademark Office*